United States Patent
Hou et al.

(10) Patent No.: US 9,054,345 B2
(45) Date of Patent: Jun. 9, 2015

(54) PIXEL DEFINING LAYER, PREPARATION METHOD THEREOF, ORGANIC LIGHT-EMITTING DIODE SUBSTRATE AND DISPLAY

(71) Applicant: BOE TECHNOLOGY GROUP CO., LTD., Beijing (CN)

(72) Inventors: Wenjun Hou, Beijing (CN); Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/342,159

(22) PCT Filed: May 31, 2013

(86) PCT No.: PCT/CN2013/076582
§ 371 (c)(1),
(2) Date: Feb. 28, 2014

(87) PCT Pub. No.: WO2014/176810
PCT Pub. Date: Nov. 6, 2014

(65) Prior Publication Data
US 2014/0329056 A1   Nov. 6, 2014

(30) Foreign Application Priority Data

Apr. 28, 2013 (CN) .......................... 2013 1 0159633

(51) Int. Cl.
*B32B 3/00* (2006.01)
*H01L 51/56* (2006.01)
(Continued)

(52) U.S. Cl.
CPC ......... *H01L 51/56* (2013.01); *Y10T 428/24802* (2015.01); *H01L 27/3246* (2013.01); *H01L 51/0003* (2013.01); *H01L 51/0007* (2013.01)

(58) Field of Classification Search
CPC . H01L 27/32; H01L 27/3246; H01L 51/0004; H01L 51/0007
See application file for complete search history.

(56) References Cited

U.S. PATENT DOCUMENTS

2007/0187675 A1    8/2007  Lee et al.
2008/0310186 A1*  12/2008  Chari et al. .................. 362/608
(Continued)

FOREIGN PATENT DOCUMENTS

CN    101020818 A    8/2007
CN    102709243 A   10/2012
(Continued)

OTHER PUBLICATIONS

International Search Report mailed Jan. 23, 2014; PCT/CN2013/076582.

*Primary Examiner* — Elizabeth Mulvaney
(74) *Attorney, Agent, or Firm* — Ladas & Parry LLP

(57) ABSTRACT

A method for preparing a pixel defining layer (PDL), an organic light-emitting diode (OLED) substrate prepared by the PDL, and a display device are provided, which can overcome the problem that the conventional PDL comprising hydrophilic and hydrophobic materials involves a complicated process. The method for preparing the PDL comprises: step 1: forming a mixed solution on a substrate to form a mixed solution film, in which the mixed solution includes a hydrophilic material, a hydrophobic material and a solvent; step 2: performing heat treatment on the mixed solution film to form a pixel defining material layer in which the content of the hydrophilic material on the upper portion is less than that of the hydrophilic material on the lower portion and the content of the hydrophobic material on the upper portion is more than that of the hydrophobic material on the lower portion; and step 3: forming a pattern of the PDL on the pixel defining material layer by a patterning process. This method for preparing a PDL is simple and easy to realize.

18 Claims, 3 Drawing Sheets

(51) Int. Cl.
*H01L 27/32* (2006.01)
*H01L 51/00* (2006.01)

(56) References Cited

U.S. PATENT DOCUMENTS

2011/0198598 A1* 8/2011 Kim et al. .................. 257/59
2014/0097413 A1 4/2014 Chen
2014/0139102 A1* 5/2014 Jeon et al. .................. 313/504

FOREIGN PATENT DOCUMENTS

| CN | 203205422 U | 9/2013 |
| EP | 0989778 A1 | 3/2000 |
| JP | 2008-243406 A | 10/2008 |

* cited by examiner

PIXEL DEFINING LAYER, PREPARATION METHOD THEREOF, ORGANIC LIGHT-EMITTING DIODE SUBSTRATE AND DISPLAY

TECHNICAL FIELD

Embodiments of the present invention relate to a pixel defining layer (PDL), a preparation method thereof, an organic light-emitting diode (OLED) substrate and a display device.

BACKGROUND

An organic light-emitting diode (OLED) is an organic thin film electroluminescent device and has the advantages such as simple preparation process, low cost, high luminous efficiency, capability of conveniently forming a flexible structure and the like. Therefore, the display technology using OLED has become an important display technique.

Currently, the methods for forming an organic electroluminescent layer in the OLED are as follows: (1) the vacuum evaporation method which is applicable to small organic molecules, has the characteristic of not requiring a solvent in the process of forming the organic electroluminescent layer and having a uniform film thickness, suffers high equipment investment and low material utilization, and is not applicable to the production of large-size products; and (2) methods such as spin coating, inkjet printing, nozzle coating method and the like adopting a solution of organic electroluminescent materials. The methods are applicable to polymer materials and soluble small molecules, have the characteristic of low equipment cost, and are outstanding in the large-scale and large-size production. Particularly, in the inkjet printing technology, the solution can be accurately sprayed into a pixel region to form an organic electroluminescent layer, but the maximum problem of the inkjet printing technology lies that: the solution of the organic electroluminescent materials cannot easily form the organic electroluminescent layer with uniform thicknesses in the pixel region.

Japanese patent JP2008243406 discloses a method for preparing an OLED, in which a PDL has two layers: the first layer (the lower layer) is made of an inorganic hydrophilic material (the hydrophilic material is adsorbable to a solution of an organic electroluminescent material), and the second layer (the upper layer) is made of an organic hydrophobic material (the hydrophobic material is repellent to the solution of the organic electroluminescent material); by adoption of the PDL made of two layers of materials of different wettabilities, accurate inkjet printing can be performed on the solution of the organic electroluminescent material to form an organic electroluminescent material film with uniform thickness; and when the PDL is prepared, an inorganic hydrophilic material layer must be prepared at first; an organic hydrophobic material layer is prepared on the inorganic hydrophilic material layer; and then the PDL is prepared by the two layers of materials by a patterning process. Meanwhile, European patent EP0989778A1 discloses a method for forming a PDL in a two-layer structure on a substrate. By treatment with plasmas, the first layer (the lower layer) has high surface energy (hydrophilic material), and the second layer (the upper layer) has low surface energy (hydrophobic material), and then the requirements on accurate inkjet printing and film uniformity can also be met.

SUMMARY

Embodiments of the present invention provide a PDL, a preparation method which has simple process and can easily obtain the PDL, an OLED substrate and a display device.

In one aspect, the present invention provides a method for preparing a pixel defining layer (PDL), which comprises the following steps:

step 1: forming a mixed solution on a substrate to form a mixed solution film, in which the mixed solution includes a solvent, and a hydrophilic material and a hydrophobic material dissolved in the solvent;

step 2: performing a heat treatment on the mixed solution film to form a pixel defining material layer in which a content of the hydrophilic material on an upper portion is less than that of the hydrophilic material on a lower portion and a content of the hydrophobic material on the upper portion is more than that of the hydrophobic material on the lower portion; and step 3: forming a pattern of the PDL by a patterning process.

In another aspect, the present invention provides a PDL, which is prepared by the above method.

In still another aspect, the present invention provides an OLED substrate, which comprises the foregoing PDL.

In still another aspect, the present invention provides a display device, which comprises the foregoing OLED substrate.

An embodiment of the present invention can form the pixel defining material layer, in which the content of the hydrophilic material on the upper portion is less than that of the hydrophilic material on the lower portion and the content of the hydrophobic material on the upper portion is more than that of the hydrophobic material on the lower portion, in one step. Therefore, the process is simple and the applicability is wide.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1:
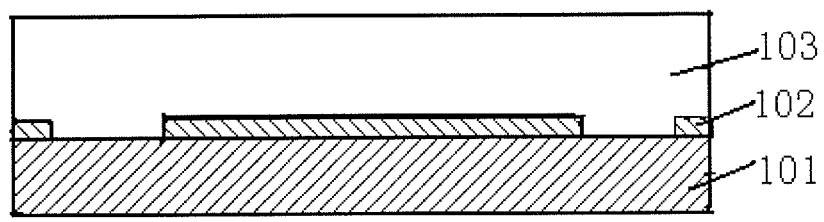
FIG. 1 is a schematic structural view illustrating the state after a pixel defining material layer is formed on a substrate in a method for preparing a PDL in embodiments 2 and 3 of the present invention.

Reference numerals of accompanying drawings:
101. Substrate; 102. First Electrode; 103. Pixel Defining Material Layer; 201. Pixel Defining Layer (PDL); 301. Solution; 401. Organic Film; 501. Organic Electroluminescent Layer; 502. Second Electrode; 5011. Organic Electroluminescent Material Layer; 5012. Hole Injection Layer; 5013. Hole Transport Layer; 5014. Electron Transport Layer; 5015. Electron Injection Layer.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Unless otherwise defined, the technical or scientific terms used herein have normal meanings understood by those skilled in the art. The words "first", "second" and the like used in the description and the claims of the patent application of the present invention do not indicate the sequence, the number or the importance but are only used for distinguishing different components. Similarly, the words "a", "an" and the like also do not indicate the number but indicate at least one. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on". "below", "left", "right" and the like only indicate the relative position relationship which is correspondingly changed when the absolute position of a described object is changed.

The inventors found that the traditional method for preparing the PDL at least has the following problems: as the PDL in the two-layer structure must be prepared by two steps, the process is complex; different devices are applied, plasma enhanced chemical vapor deposition (PECVD) is used when a hydrophilic material, particularly inorganic hydrophilic material, is involved, and the equipment is expensive; and because an organic material and an inorganic material have interfacial problem therebetween, the phenomenon of delamination tends to occur.

Therefore, embodiments of the present invention provide a PDL, a preparation method which has simple process and can easily obtain a PDL, an OLED substrate and a display device.

Embodiment 1

The embodiment provides a method for preparing a PDL, which comprises the following steps:

step 1: coating a mixed solution on a substrate to form a mixed solution film, in which the mixed solution includes a hydrophilic material, a hydrophobic material and a solvent;

step 2: performing heat treatment on the mixed solution film to form a pixel defining material layer in which the content of the hydrophilic material on the upper portion is less than that of the hydrophilic material on the lower portion and the content of the hydrophobic material on the upper portion is more than that of the hydrophobic material on the lower portion; and step 3: forming a pattern of the PDL on the pixel defining material layer by one patterning process.

In the embodiment, the hydrophilic material and the hydrophobic material are mixed with the solvent thereof, and then the pixel defining material layer, in which the content of the hydrophilic material on the upper portion is less than that of the hydrophilic material on the lower portion and the content of the hydrophobic material on the upper portion is more than that of the hydrophobic material on the lower portion, can be formed in one step, and finally the PDL can be formed by a patterning process. Compared with the conventional methods, the method in the embodiment has the advantages of simple process and wider applicability.

Embodiment 2

Figure 2:
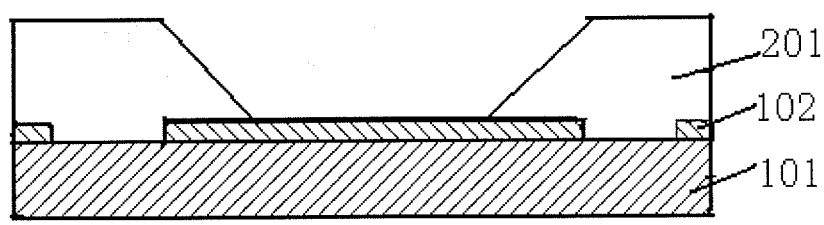
FIG. 2 is a schematic structural view of the PDL formed by the method for preparing the PDL in embodiments 2, 3 and 5 of the present invention.

As illustrated in FIGS. 1 and 2, the embodiment provides a method for preparing a PDL 201, which comprises the following steps:

Step 1: coating a mixed solution on a substrate 101 to form a mixed solution film. The mixed solution includes a hydrophilic material, a hydrophobic material and a solvent; and the solvent includes a hydrophilic material solvent and a hydrophobic material solvent, namely the hydrophilic material is mainly dissolved in a low boiling point solvent and the hydrophobic material is mainly dissolved in a high boiling point solvent.

The substrate 101 is generally a substrate 101 of an array substrate of an OLED display device, and a first electrode 102, a thin film transistor drive circuit (not shown in the figure) and other structures may also be formed on the substrate 101. The present invention is not limited thereto.

For instance, the hydrophobic material solvent (high boiling point solvent) may be any one of N, N-dimethylformamide, N, N-dimethylacetamide and dimethylsulfoxide; and the hydrophilic material solvent (low boiling point solvent) may be any one of tetrahydrofuran, dichloromethane, trichloromethane and acetone. The proportion of the hydrophilic material solvent to the hydrophobic material solvent directly influences the separation result of the hydrophilic material and the hydrophobic material. When the content of the hydrophobic material solvent is higher, the more of the hydrophobic material are gathered on the surface of the solution film. However, in order to meet the requirements on the dissolution of the hydrophilic material in the hydrophilic material solvent and the content of the hydrophobic material on the upper layer, the volume of the hydrophobic material solvent may generally be 30 to 60 percent of the total volume of the solvent.

Step 2: heating the mixed solution film at a first temperature at first and then heating the mixed solution film at a second temperature.

When the mixed solution film is heated at the first temperature at first, namely heated at a low temperature, because the hydrophobic material is mainly dissolved in the low boiling point solvent, under the condition of low temperature, along with the volatilization of the low boiling point solvent, the hydrophobic material are migrated to the surface of the film accordingly and precipitated out; and when the mixed solution film is heated at the second temperature, namely heated at a high temperature, because the hydrophilic material is mainly dissolved in the high boiling point solvent, under the condition of high temperature, along with the volatilization of the high boiling point solvent, the hydrophilic material are gradually precipitated out, and finally a pixel defining material layer 103 in which the content of the hydrophilic material on the upper portion is less than that of the hydrophilic material on the lower portion and the content of the hydrophobic material on the upper portion is more than that of the hydrophobic material on the lower portion is formed. For instance, the first temperature is higher than the boiling point of the hydrophobic material solvent but lower than the boiling point of the hydrophilic material solvent, and the second temperature is higher than the boiling point of the hydrophilic material solvent. For instance, preferably, the first temperature may be 10 to 30° C., and the second temperature may be 150 to 500° C.

Step 3: forming the pattern of the PDL 201 on the pixel defining material layer 103 by a patterning process.

For instance, preferably, the mixed solution further includes a photoresist. In this case, the pixel defining material layer 103 may be directly subjected to exposure and development without further coating a photoresist layer in the step 3. Therefore, the process can be further simplified.

Figure 3:
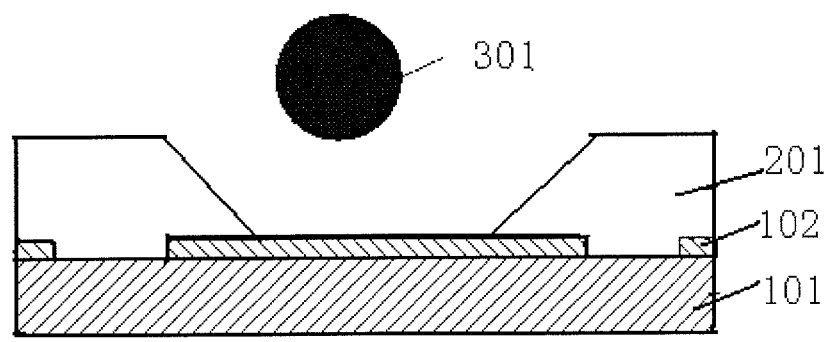
FIG. 3 is a schematic diagram illustrating the process of forming an organic film by the inkjet printing method in the PDL formed by the method for preparing the PDL in embodiment 2 of the present invention.
Figure 4:
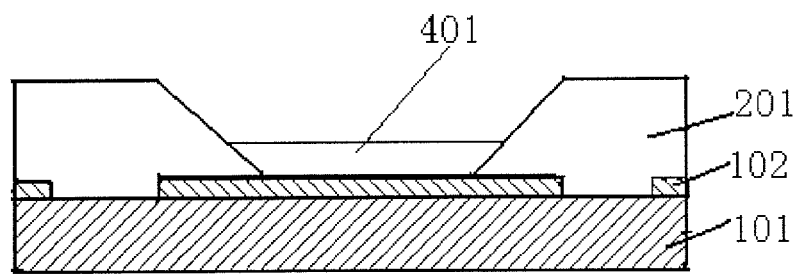
FIG. 4 is a schematic structural view illustrating the process of forming the organic film by the inkjet printing method in the PDL formed by the method for preparing the PDL in embodiment 2 of the present invention.

As illustrated in FIGS. 3 and 4, in the PDL 201 formed in the embodiment, as the content of the hydrophilic material on the upper portion is less than the content of the hydrophobic material on the upper portion, the upper portion shows a hydrophobic property and repellent to a solution 301. Therefore, in the case of inkjet printing in a pixel region defined by the PDL 201, the solution 301 will also flow into the pixel region even the solution 301 is deviated from the pixel region. As the content of the hydrophilic material on the lower portion of the PDL 201 is more than the content of the hydrophobic material, the lower portion shows a hydrophilic property and adsorbable to the solution. Therefore, when the solution 301 is sprayed onto the pixel region, an organic film 401 with a uniform thickness of the solution 301 is naturally formed. Moreover, as the upper portion of the PDL shows a hydrophobic property and the content of chemically-reactive substances is low, the uniformity of the thickness of the inkjet printing film can be effectively improved, and then the service life of an OLED/polymer light-emitting diode (PLED) device can be beneficially improved.

Embodiment 3

As illustrated in FIGS. 1 and 2, the embodiment provides a method for preparing a PDL, which is substantially the same as the preparation method in the embodiment 2. The method of the embodiment comprises the following steps:

Step 1: coating a mixed solution on a substrate 101 to form a mixed solution film. The mixed solution includes a hydrophilic material, a hydrophobic material and a solvent.

The solvent in the embodiment is different from the solvent in embodiment 1, may be at least one solvent in which both the hydrophilic material and the hydrophobic material can be dissolved, or may be at least two kinds of solvent in which the hydrophilic material and the hydrophobic material can be respectively dissolved.

Step 2: forming a pixel defining material layer 103 on the substrate obtained after the above step. One example of the step 2 may include the following steps 201 and 202:

Step 201: evaporating the solvent in the mixed solution film to dryness to form a solid film.

For instance, preferably, the temperature of the solvent in the mixed solution film which is evaporated to dryness is lower than the glass transition temperature of the hydrophobic material. That is to say, when the temperature is less than the glass transition temperature of the hydrophobic material (flexible polymer), the solvent can be evaporated to dryness, and the temperature of the solvent in the mixed solution film which is evaporated to dryness is generally less than 100° C.

Step 202: subsequently, heating the mixed solution film to a temperature more than the glass transition temperature of the hydrophobic material, in which the heating temperature is lower than the glass transition temperature of the hydrophilic material; and forming the PDL 103 in which the content of the hydrophilic material on the upper portion is less than that of the hydrophilic material on the lower portion and the content of the hydrophobic material on the upper portion is more than that of the hydrophobic material on the lower portion.

When the heating temperature is raised up to close the glass transition temperature of the hydrophobic material (flexible polymer), the segments of the hydrophobic material (flexible polymer) tend to move toward and are gathered around the surface of the film. Subsequently, along with the extension of the annealing temperature time (the annealing time is generally 15 to 60 minutes), one layer of hydrophobic material is finally formed on the surface of the solid film, and the hydrophilic material is on the lower portion of the hydrophobic material.

If the heating temperature is also raised up to close the glass transition temperature of the hydrophilic material, internal structures in the hydrophilic material (rigid polymer) will also move but cannot move violently just like the hydrophobic material (flexible polymer), and the state of the materials gathered to the surface of the polymer film is still that the content of the hydrophobic material is more than that of the hydrophilic material.

For instance, preferably, the hydrophilic material is a rigid polymer, and the hydrophobic material is a flexible polymer. Moreover, for instance, the rigid polymer is polyimide, bisphenol A polycarbonate, polymer of which a main chain includes a benzene ring, or polymer of which a main chain includes a cyclic rigid structure (so that the main chain cannot be easily rotated and stretched); and the flexible polymer is polysiloxane, fluorine-containing polyolefin or fluorine-containing polyalkylene oxide, for instance, fluorinated polypropylene, fluorinated poly(1-butene), fluorinated poly(4-methyl-1-pentene), fluorinated polyethylene oxide and fluorinated polypropylene oxide.

Moreover, for instance, the glass transition temperature of the hydrophobic material is 150 to 300° C.

The step 3 is the same as that of the embodiment 1. No further description will be repeated here.

Embodiment 4

As illustrated in FIG. 2, the embodiment provides a PDL. The PDL 201 is prepared by any method in embodiment 1, 2 or 3.

The PDL 201 of the embodiment may have a structure in which the state that the content of the hydrophilic material on the lower portion is more than the content of the hydrophobic material is gradually converted to the state that the content of the hydrophobic material on the upper portion is more than the content of the hydrophilic material. Preferably, the PDL 201 has a structure in which the content of the hydrophilic material is gradually increased and the content of the hydrophobic material is gradually reduced from the upper portion to the lower portion.

Of course, the PDL may also have a two-layer structure in which the hydrophobic material is on the upper portion and the hydrophilic material is on the lower portion.

As the PDL 201 of the present invention is prepared by the above preparation method, only one-step film forming process is required, so that the process is simple, and then the cost of the process and the equipment thereof can be reduced.

Embodiment 5

As illustrated in FIG. 2, the embodiment provides an OLED substrate. A PDL 201 of the OLED substrate is prepared by any method in embodiment 1, 2 or 3.

The method for preparing the OLED substrate in the embodiment may comprise the following steps:

step 1: forming a pattern of a first electrode 102 (typically an anode, and a cathode is also feasible) on a substrate 101 by a patterning process; and step 2: preparing a PDL 201. The preparation method adopts any method in embodiment 1, 2 or 3. No further description will be repeated here.

As the PDL 201 in the embodiment is prepared by the preparation method in embodiment 1, 2 or 3, the process of the embodiment is simple. And meanwhile, as the content of the hydrophilic material on the upper portion in the PDL 201 is less than the content of the hydrophilic material on the lower portion and the content of the hydrophobic material on the upper portion is more than the content of the hydrophobic material on the lower portion, films of an organic electroluminescent layer 501, a hole injection layer 5012 and a hole transport layer 5013 prepared by the inkjet printing method have uniform thickness.

Embodiment 6

Figure 5:
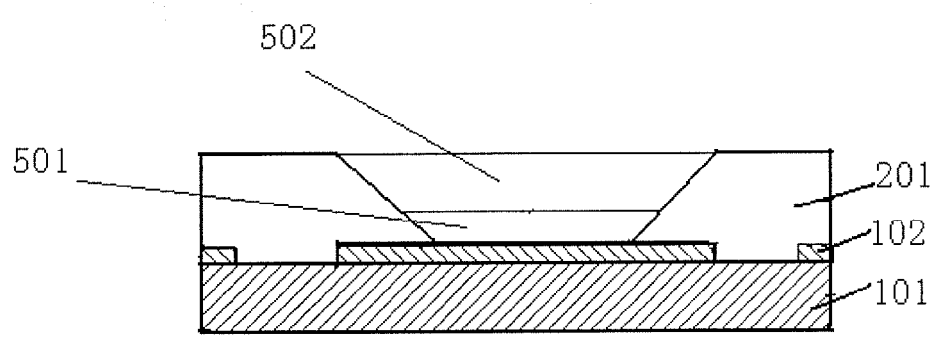
FIG. 5 is a schematic diagram of an OLED panel in embodiment 6 of the present invention.

As illustrated in FIG. 5, the embodiment provides an OLED panel. The OLED panel comprises an OLED substrate. A PDL 201 of the OLED substrate is prepared by any method in embodiment 1, 2 or 3.

The method for preparing the OLED panel in the embodiment may comprise the following steps:

step 1: forming a pattern of a first electrode 102 (typically an anode, of course, a cathode is also feasible) on a substrate 101 by a patterning process;

step 2: preparing the PDL, in which the preparation method adopts any method in embodiment 1, 2 or 3 and will not be further described here; and step 3: forming an organic electroluminescent layer 501 on a first electrode layer 102 in a pixel region defined by the PDL 201.

Figure 6:
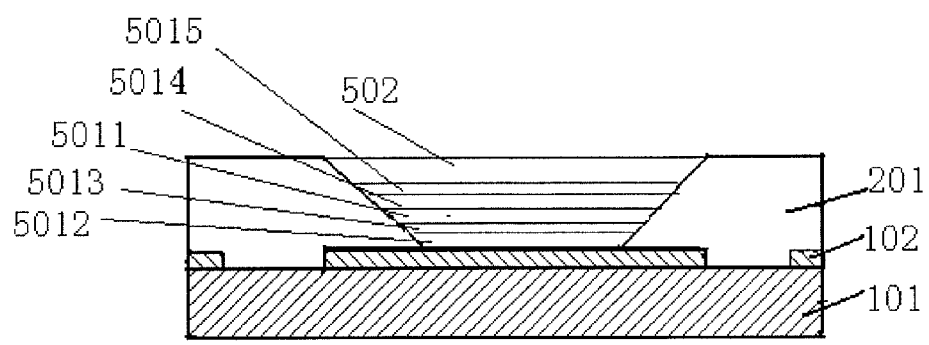
FIG. 6 is another schematic diagram of the OLED panel in embodiment 6 of the present invention.

As illustrated in FIG. 6, the organic electroluminescent layer 501 is a structure for emitting light under the action of current, may be a single-layer structure, or may be formed by a plurality of different layers. The organic electroluminescent layer 501 at least includes an organic electroluminescent material layer 5011, but for instance, may also include: an electron transport layer (ETL) 5014 and an electron injection layer (EIL) disposed between the organic electroluminescent material layer 5011 and a cathode (generally a second electrode 502), a hole injection layer (HIL) 5012 and a hole transport layer (HTL) 5013 disposed between the organic electroluminescent material layer 5011 and an anode (generally a first electrode 102), and other structures.

Therefore, one example of the step 3 may further include the following steps 301 to 305:

step 301: forming the HIL 5012 on the first electrode layer 102 in the pixel region defined by the PDL 201;

step 302: forming the HTL 5013 on the HIL 5012;

step 303: farming the organic electroluminescent material layer 5011 on the HTL 5013;

step 304: forming the ETL 5014 on the organic electroluminescent material layer 5011; and step 305: forming the EIL 5015 on the ETL 5014.

Step 4: forming a second electrode layer 502 (typically a cathode; of course, an anode is also feasible) on the organic electroluminescent layer 501.

The steps of forming the HIL 5012 on the anode (the first electrode 102) layer in the pixel region defined by the PDL, forming the HTL 5013 on the HIL 5012, and forming the organic electroluminescent material layer 5011 on the HTL 5013 all employ the inkjet printing method.

The steps of forming the ETL 5014 on the organic electroluminescent material layer 5011, forming the EIL 5015 on the ETL 5014, and forming the cathode (the second electrode 502) layer on the EIL 5014 all employ the vapor deposition method.

As the PDL 201 in the embodiment is prepared by the preparation method in embodiment 1, 2 or 3, the process of the embodiment is simple. And meanwhile, as the content of the hydrophilic material on the upper portion of the PDL 201 is less than the content of the hydrophilic material on the lower portion and the content of the hydrophobic material on the upper portion is more than the content of the hydrophobic material on the lower portion, films of the organic electroluminescent layer 501, the HIL 5012 and the HTL 5013 prepared by the inkjet printing method have uniform thickness.

Of course, a PLED may also be prepared by the same method as the above-mentioned. A PLED is one type of an OLED. The difference between a PLED and a conventional OLED is that a polymer organic electroluminescent layer is applied therein.

Embodiment 7

The embodiment provides a display device. An array substrate includes the OLED panel in embodiment 6.

The display device may be a mobile phone, a tablet PC, a television, a display, a notebook computer, a digital picture frame, a navigator or any other product or component with display function.

The display device in the embodiment has the OLED structure as illustrated in embodiment 6, so that the display device has a simple preparation process and low cost.

Of course, the OLED display device in the embodiment may further comprise other conventional components, for instance, an encapsulation substrate for cell assemble with the array substrate, a power unit and a display drive unit.

The foregoing is only the preferred embodiments of the present invention and not intended to limit the scope of protection of the present invention. The scope of protection of the present invention should be defined by the appended claims.

The invention claimed is:

1. A method for preparing a pixel defining layer (PDL), comprising the following steps:

step 1: forming a mixed solution on a substrate to form a mixed solution film, in which the mixed solution includes a solvent, and a hydrophilic material and a hydrophobic material dissolved in the solvent;

step 2: performing a heat treatment on the mixed solution film to form a pixel defining material layer in which a content of the hydrophilic material on an upper portion is less than that of the hydrophilic material on a lower portion and a content of the hydrophobic material on the upper portion is more than that of the hydrophobic material on the lower portion; and step 3: forming a pattern of the PDL by a patterning process.

2. The method for preparing the PDL according to claim 1, wherein the solvent includes a hydrophilic material solvent and a hydrophobic material solvent, and a boiling point of the hydrophilic material solvent is higher than that of the hydrophobic material solvent; and the step 2 further comprises:

heating the mixed solution film at a first temperature at first and then heating the mixed solution film at a second temperature, and forming the pixel defining material layer in which the content of the hydrophilic material on the upper portion is less than that of the hydrophilic material on the lower portion and the content of the hydrophobic material on the upper portion is more than that of the hydrophobic material on the lower portion, wherein the first temperature is higher than the boiling point of the hydrophobic material solvent and lower than the boiling point of the hydrophilic material solvent, and the second temperature is higher than the boiling point of the hydrophilic material solvent.

3. The method for preparing the PDL according to claim 2, wherein a volume of the hydrophobic material solvent is 30 to 60 percent of a total volume of the solvent.

4. The method for preparing the PDL according to claim 2, wherein the hydrophilic material solvent is N,N-dimethylformamide, N,N-dimethylacetamide or dimethylsulfoxide; and the hydrophobic material solvent is tetrahydrofuran, dichloromethane, trichloromethane or acetone.

5. The method for preparing the PDL according to claim 2, wherein the first temperature is 10 to 30° C.; and the second temperature is 150 to 500° C.

6. The method for preparing the PDL according to claim 1, wherein the step 2 further comprises:

removing the solvent in the mixed solution film, heating the mixed solution film to a temperature more than a glass transition temperature of the hydrophobic material, and forming a pixel defining material layer in which the content of the hydrophilic material on the upper portion is less than that of the hydrophilic material on the lower portion and the content of the hydrophobic material on the upper portion is more than the hydrophobic material on the lower portion, wherein the glass transition temperature of the hydrophobic material is lower than that of the hydrophilic material.

7. The method for preparing the PDL according to claim 6, wherein the step of removing the solvent in the mixed solution film comprises evaporating the solvent in the mixed solution film to dryness to form a solid film.

8. The method for preparing the PDL according to claim 6, wherein the glass transition temperature of the hydrophobic material is 150 to 300° C.

9. The method for preparing the PDL according to claim 1, wherein the hydrophilic material is rigid polymer; and the hydrophobic material is flexible polymer.

10. The method for preparing the PDL according to claim 9, wherein the rigid polymer is polyimide, bisphenol A polycarbonate, polymer of which a main chain includes alkyl, or polymer of which a main chain includes a cyclic rigid structure; and the flexible polymer is polysiloxane, fluorine-containing polyolefin, or fluorine-containing polyalkylene oxide.

11. The method for preparing the PDL according to claim 10, wherein the fluorine-containing polyolefin is fluorinated polypropylene, fluorinated poly(1-butene), or fluorinated poly(4-methyl-1-pentene); and the fluorine-containing polyalkylene oxide is fluorinated polyethylene oxide or fluorinated polypropylene oxide.

12. The method for preparing the PDL according to claim 1, wherein the mixed solution further comprises a photoresist.

13. An organic light-emitting diode (OLED) substrate, comprising a pixel defining layer prepared by any preparation method according to claim 1.

14. A display device, comprising the OLED substrate according to claim 13.

15. The OLED substrate according to claim 13, wherein the PDL is a structure in which a content of a hydrophilic material is gradually increased and a content of a hydrophobic material is gradually reduced from an upper portion to a lower portion.

16. The OLED substrate according to claim 13, wherein the PDL includes a two-layer structure in which an upper layer is a hydrophobic material layer and a lower layer is a hydrophilic material layer.

17. The method for preparing the PDL according to claim 7, wherein a temperature of the solvent in the mixed solution film which is evaporated to dryness is lower than the glass transition temperature of the hydrophobic material.

18. The method for preparing the PDL according to claim 17, wherein the glass transition temperature of the hydrophobic material is 150 to 300° C.

* * * * *